(12) United States Patent
Meltzer

(10) Patent No.: US 7,212,050 B2
(45) Date of Patent: May 1, 2007

(54) SYSTEM AND METHOD FOR SYNTHESIZING A CLOCK AT DIGITAL WRAPPER (FEC) AND BASE FREQUENCIES USING ONE PRECISION RESONATOR

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/016,314

(22) Filed: Dec. 17, 2004

(65) Prior Publication Data

US 2006/0132202 A1    Jun. 22, 2006

(51) Int. Cl.
*H03L 7/06* (2006.01)
(52) U.S. Cl. .......................... 327/156; 327/147; 331/17
(58) Field of Classification Search ........ 327/156–158, 327/105, 147–148; 331/1 A, 17
See application file for complete search history.

(56) References Cited

U.S. PATENT DOCUMENTS

| | | | | |
|---|---|---|---|---|
| 4,868,524 | A | * | 9/1989 | Costlow et al. ............... 331/16 |
| 5,146,186 | A | * | 9/1992 | Vella ........................... 331/16 |
| 5,148,122 | A | * | 9/1992 | Karlquist ...................... 331/3 |
| 5,986,514 | A | * | 11/1999 | Salvi et al. .................... 331/17 |
| 6,014,048 | A | | 1/2000 | Talaga, Jr. et al. |
| 6,100,736 | A | | 8/2000 | Wu et al. |
| 6,188,288 | B1 | * | 2/2001 | Ragan et al. ................. 331/16 |
| 6,259,283 | B1 | | 7/2001 | Nguyen |
| 6,404,247 | B1 | * | 6/2002 | Wang .......................... 327/158 |
| 2002/0133732 | A1 | | 9/2002 | Lin et al. |

FOREIGN PATENT DOCUMENTS

WO    02/51060    6/2002

OTHER PUBLICATIONS

A 900-MHz Local Oscillator Using a DLL-Based Frequency Multiplier Technique for PCS Applications, George Chien and Paul R. Gray, IEEE Journal of Solid-State Circuits, vol. 35, No. 12, Dec. 2000, pp. 1996-1999.

Low-Noise Local Oscillator Design Techniques using a DLL-based Frequency Multiplier for Wireless Applications, George Chien, PhD., Dissertation, Engineering-Electrical Engineering and Computer Sciences, Graduate Division, University of California, Berkeley, Spring 2000, pp. 71-74.

* cited by examiner

*Primary Examiner*—Dinh T. Le
(74) *Attorney, Agent, or Firm*—Rosalio Haro

(57) ABSTRACT

A precision PLL based transceiver having a single precision SAW or crystal resonator is configured to lock onto multiple different input frequencies and output generated clocks at the multiple different frequencies. The input reference frequency may be higher or lower than the resonator frequency. A fraction of two whole numbers describing a ratio of the resonator frequency to a given input frequency reference is first obtained. One of the numerator or denominator in the fraction is used to set the divide value of a first frequency divider coupling a VFO based on the resonator to a feedback input on a PFD. The other of the numerator or denominator is used to set a second frequency divider coupling the input frequency reference signal to the PFD. A first frequency multiplier is given a multiplication factor matching the divide value of the second frequency divider, and used to couple the output of the first frequency divider to the output of the PLL. Alternatively, a second frequency divider may be inserted between the reference frequency input and the PFD to match the frequency, or a multiple thereof, of the VFO output, which may bypass the first frequency divider in the feedback path to the PFD.

8 Claims, 9 Drawing Sheets

SYSTEM AND METHOD FOR SYNTHESIZING A CLOCK AT DIGITAL WRAPPER (FEC) AND BASE FREQUENCIES USING ONE PRECISION RESONATOR

BACKGROUND OF THE INVENTION

1. Field of the Invention

The present invention relates generally to clock synthesizers based on digital phase locked loops (PLL) and more particularly to clock synthesizers for serial digital communications systems which may actively be switched to using a base frequency and a forward error correction (FEC) frequency.

2. Description of the Related Art

Serial data communication systems use phase lock loop (PLL) clock generators locked to a reference frequency input (or reference clock input) to generate internal clocks. For example, serial data communication systems use PLL clock generators locked to a reference frequency input to generate local (i.e. internal) transmit clocks. In a wireless system, this clock defines both the modulation and broadcast frequency. In a wireline system, e.g. SONET/SDH, it defines the bit rate of the transmitter. All wireline systems define both a base bit rate and a forward error correction, FEC, rate. This FEC rate is necessarily higher than the basic data bit rate to allow for the inclusion of additional forward error correcting code redundancy bits into the base transmitted data, i.e. into the same time window used to send one data unit (or packet) at the basic rate. Thus, a different transceiver (with a different operating frequency) is typically needed for systems that operate at the basic bit rate without error correction code, and for systems that include FEC and thus operate at a higher bit rate.

With reference to FIG. 1, a typical PLL based frequency synthesizer 11, such as those used in high precision transceivers, use a SAW or crystal based oscillator 13. That is, oscillator 13 includes a precision variable frequency oscillator, VFO, 15 whose precision operation is based on the resonant quality of SAW or crystal resonator 17. A reference clock input provides a nominal system frequency whose long term average value is to be used for generating the local output clock. A combination phase and frequency detector, PFD, and charge pump unit 19 compares in phase and frequency the reference clock input to a feedback signal based on the output from oscillator 13, i.e. the internal output clock from VFO 15. PFD and Charge Pump unit 19 produces a control signal dependent upon the comparison result, and the control signal is used to adjust VFO 15 accordingly. A loop filter 21, such as a low pass filter, assures that the average of the comparison result is used to control the oscillator so as to avoid spurious comparison results due to, for example, momentary glitches or spikes.

Sometimes, the desired frequency of the local, i.e. internal, output clock is much higher than the frequency of the reference clock input. Therefore, a frequency divider 23 may be inserted between the output of oscillator 13 and the feedback input of PFD and Charge Pump unit 19. In this case, the reference clock input is compared to a frequency-divided, down-converted output from precision VFO 15. The filtered control signal (voltage or current) is used to set the frequency of oscillator VFO 15, which provides the local output clock signal.

Different reference clock input frequencies may be used to produce the same output clock frequency (and thus use the same SAW or Crystal resonator 17) by configuring divider block 23 to divide by different integer values. For example, it is common practice to generate a 622.08 MHz local output clock for SONET/SDH applications by using either a 622.08 MHz reference input clock or a 155.52 MHz reference input clock by setting frequency divider block 23 to a value of divide by 1 or 4, respectively. It is to be understood that if the frequency of the input reference clock (i.e. 622.08 MHz) matches the frequency of the local clock output (i.e. 622.08 MHz), frequency divider block 23 is ideally not needed.

Thus, a conventional PLL can have binary dividers in the feedback path to lock the VFO output to a reference clock input whose frequency is an integer multiple of the VFO output frequency. Another technique well known in the art is to use a dual modulus divider with a division ratio of either n or n+1 [e.g. 31 and 32] and switching between the two values dynamically in a relationship fixed by the desired output frequency. But this technique introduces spurious signals into the clock output spectrum which makes it unsuitable for precision clocks for e.g. SONET/SDH.

Although different reference clock inputs may be used to produce the same local clock output by use of appropriate frequency division in the feedback path, the same SAW or Crystal resonator 17 cannot typically be used to produce different output clocks since operation of VFO 15 is directly tied to the fixed frequency of the SAW or Crystal resonator 17. That is, a precision PLL based frequency synthesizer requires a different resonator 17 for each different output clock frequency.

It would be highly desirable to use the same transceiver module in both systems with error correction coding and in systems without error correction coding. Using a single transceiver for both systems would reduce cost in design, material procurement, and manufacturing. This would mean however, that the clock generator within the transceiver module should be able to alternate between at least two precise output operating frequencies (preferably under electronic control), and the transceiver should be capable of selectively generating either the FEC operating frequency or the base operating frequency.

Wireline systems, especially SONET/SDH long haul service, have stringent frequency stability requirements that require the use of a stable frequency reference in the oscillator. The need for stringent frequency stability means that the frequency reference is typically a precision variable frequency oscillator using a SAW resonator, a quartz crystal resonator, or other precision resonator.

With reference to FIG. 2, an example of PLL based frequency synthesizer 31 suitable for use in a precision transceiver module capable of electronically selecting between two output frequencies (i.e. a base operating frequency and an FEC operating frequency) utilizes two oscillators 13a and 13b, and a multiplexer 33 for selecting between the two oscillators 13a and 13b. All elements similar to those of FIG. 1 have similar reference characters and are explained above. Preferably, the first oscillator 13a is designed to produce a first output frequency, i.e. the base frequency, and the second oscillator 13b is designed to produce the second output frequency, i.e. the FEC frequency. As a result, duplicate VFO's 15a and 15b (each based on a different frequency resonator 17a and 17b, respectively) are required to create oscillators 13a and 13b. The frequency control voltage from PFD and Charge Pump unit 19 is fed to both variable frequency oscillators 15a and 15b, each of which oscillates at respective first and second frequencies. Multiplexer 33 selects the output according to the state of a Frequency Select control signal.

Unfortunately to maintain a high precision of operation, two different precision resonators 17a and 17b are required in this design. Precision resonators, such as 17a and 17b, are typically relatively expensive discrete components that add to system cost and space requirements. It is therefore highly desirable that the transceiver which operates at both FEC and base data rates use only one such precision resonant device to generate both output frequencies.

OBJECTS OF THE INVENTION

The present invention is directed to solving these problems.

It is an object of the present invention to provide a PLL based clock synthesizer that uses only one precision resonator, SAW or crystal, to lock onto and generate multiple frequencies.

It is a further object that the multiple frequencies not be restricted to integer multiples the resonator frequency.

More specifically, an object of the present invention is to provide a technique for synthesizing clocks at both a base frequency rate and a rate which accommodates forward error correction bits from a reference frequency using only one precision resonator.

An additional objective of our invention to be able to switch between the frequencies using only electronic means.

SUMMARY OF THE INVENTION

A PLL based frequency synthesizer, or clock generator, is disclosed that achieves generation of both base and FEC clock rates using one precision resonator. The PLL of the present invention is characterized by a variable frequency oscillator, VFO, based on a precision resonator, SAW, crystal, or known precision resonator. As it is known in the field of phase locked loops, PLL's, a VFO based on a resonator produces a frequency substantially equal to that of the resonator's with only slight modification in phase or frequency adjustment in order to produce an output frequency signal locked onto a reference input frequency. That is, the VFO has a center frequency substantially similar to that of the resonator's, but may adjust its output within a small range about this center frequency in accordance to a control signal from a phase and frequency detector, PFD, that compares the output from the VFO with a reference frequency input. Therefore, the output frequency of the VFO should ideally match the frequency of the reference frequency input applied to the PLL. Alternatively, a frequency divided representation of the VFO output could be matched to the reference frequency input applied to the PLL. In this manner, the output from the VFO is said to be locked onto the reference frequency input applied to the PLL. This approach is suitable when the (generally fixed) resonator frequency (or a directly frequency-divided representation of the resonator frequency) matches the frequency of the reference frequency input applied to the PLL.

In order to match the relatively fixed frequency output of from VFO to any of multiple input reference frequencies and to convert the VFO output to any of multiple desired local clocks, the present invention introduces additional frequency division blocks and frequency multiplication blocks. For example, a ratio relating the fixed resonator frequency to any input reference frequency input may be obtained by dividing the frequency value of the resonator with that of the applied reference frequency input. This ratio may be a rational or irrational number, but preferably a search for a common factor for both the frequency value of the resonator and that of the applied reference frequency will produce a fraction comprised of a whole number in the numerator and a whole number in the denominator. This fraction may not be an exact match for the calculated ratio, but will suffice as long as the fraction matches the calculated ratio to a predetermined amount of precision (or within a predetermined number of significant figures). Once the fraction of whole numbers is obtained (preferably in reduced form, i.e. using their lowest common denominator), one of the numerator or denominator integers is used to set a first integer frequency divider coupling the output from the VFO to a feedback input node of the PLL. The other of the numerator or denominator integers is used to set a second integer frequency divider coupling the applied reference frequency signal to the reference input node of the PLL. In this manner, both the feedback input node of the PLL and the reference input node of the PLL are made to have substantially the same frequency irrespective of whether the frequency of the applied reference frequency input matches that of the resonator's. Furthermore, the resonator frequency is thereby locked onto the applied reference frequency input irrespective of a difference in their frequency values.

However, since the resonator frequency, and therefore the VFO's output frequency does not match that of the applied reference input, a (preferably integer) frequency multiplier is applied to the output of the first integer frequency divider, and the integer value of the frequency multiplier is preferably made to match the integer value of the second frequency divider. However, another multiplication value to generate an output signal whose frequency is an integer multiple of the reference frequency input may be used. In this manner, the output from the frequency multiplier is locked onto, and is made to match the frequency (or an integer multiple of the frequency) of, the applied reference frequency input.

To avoid adding any jitter to the locked frequency output from the VFO, the frequency multiplier is preferably implemented as delay locked loop, DLL, based frequency multiplier.

The above embodiment is best suited for uses where the resonator frequency is higher than the frequency of the applied reference frequency input. In an alternate embodiment better suited for applications where the frequency of the applied reference frequency input is greater than the resonator frequency, it is preferred that a second (preferably integer) frequency multiplier by inserted in the path from the applied reference frequency input to the reference input node of the PLL. Thus, the applied reference frequency input signal is subjected to a frequency division operation and a frequency multiplication operation prior to being applied to the reference input node of the PLL. In this embodiment, the integer values of the second frequency divider and second frequency multiplier are assigned values (as determined from the fraction of two whole numbers discussed above) so that the resultant up-and-down converted reference frequency signal applied to the reference input node of the PLL matches the frequency of the resonator. In this case, the output of the VFO will also substantially match that of the up-and-down converted reference frequency input signal applied to the reference input node of the PLL, and no frequency divider is needed between the output for the VFO and the feedback input node of the PLL in order to lock the VFO output to the applied reference frequency input. However, in order to assure that the PLL output frequency matches that frequency of the applied reference input signal (or an integer multiple thereof), the first frequency divider and first frequency multiplier are inserted between the output of the VFO and the output of the PLL. The integer values set for the first frequency divider and first frequency multiplier are selected so as to up-convert the output from the VFO to match the frequency (or an integer multiple of the frequency) of that of the applied reference input.

In all embodiments, it is preferred that the integer frequency dividers be implemented using counters. In this manner, the complexity and space requirement of a large integer divisor value may be reduced by breaking down a large frequency divider into a cascade of smaller frequency dividers.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Figure 1:
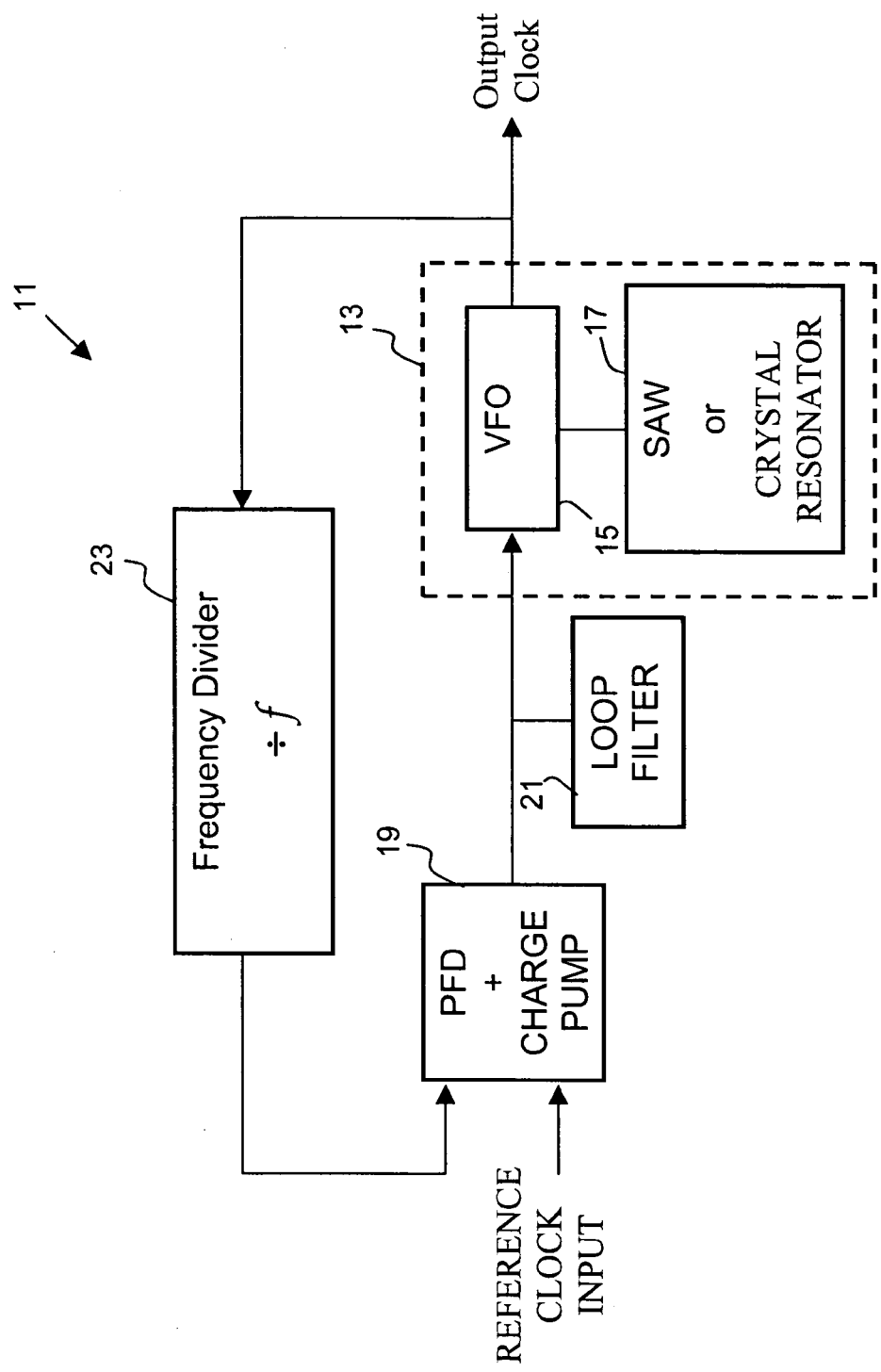
FIG. 1 is a block diagram of a typical precision PLL.
Figure 2:
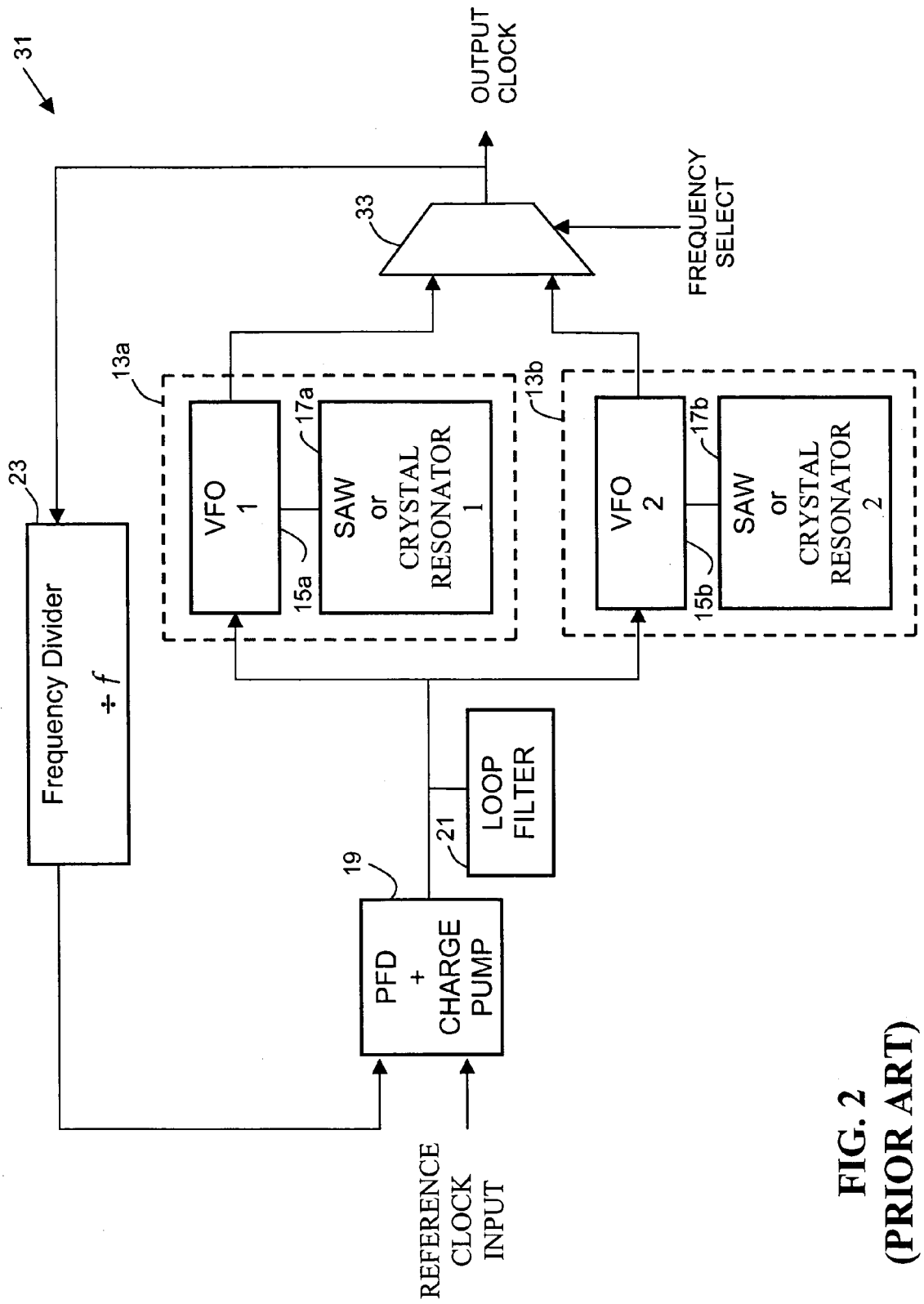
FIG. 2 is a block diagram of a prior art precision PLL suitable for locking onto, and outputting, two different frequencies.
Figure 3:
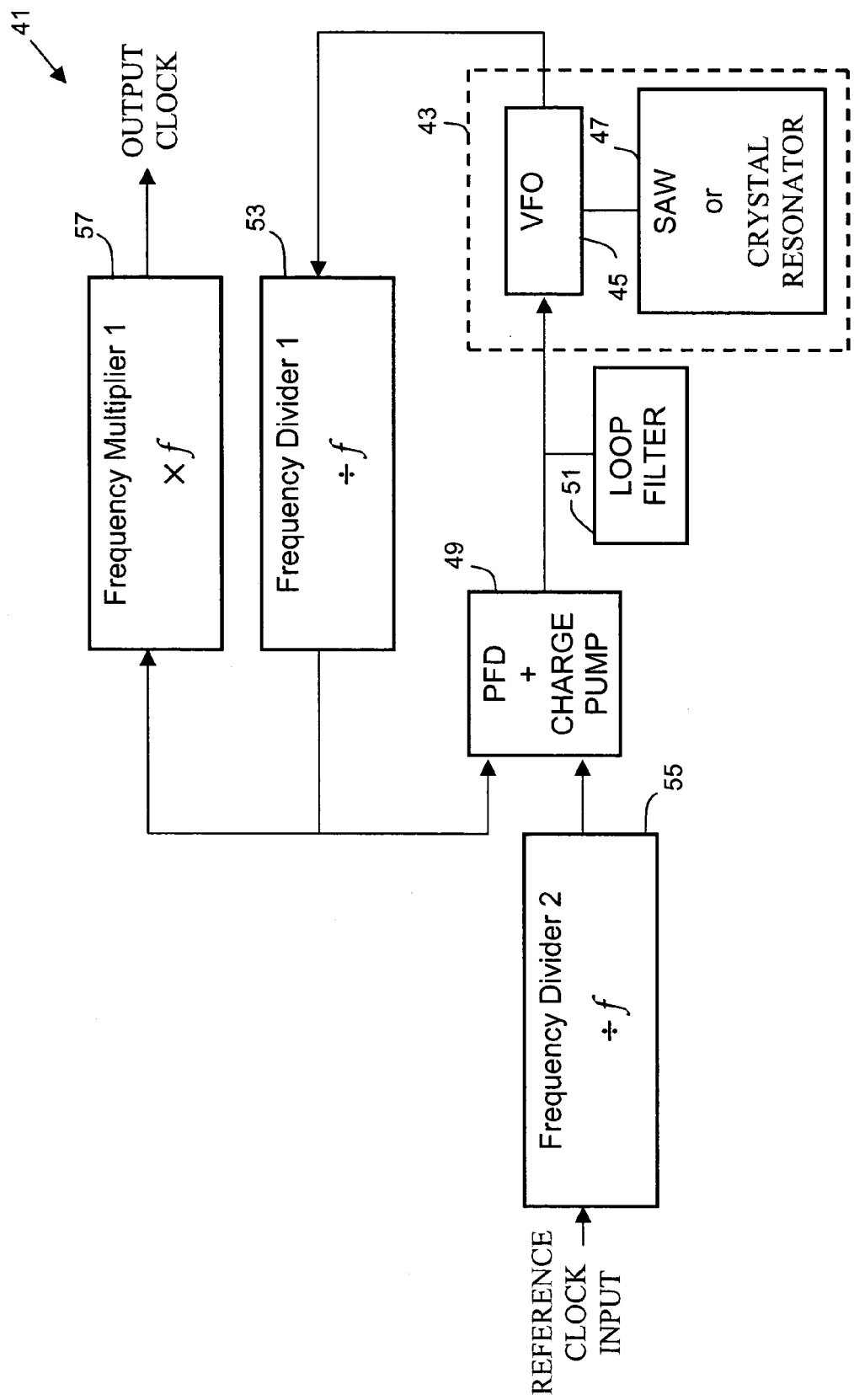
FIG. 3 is block diagram of a precision PLL in accord with a first embodiment of the present invention.

With reference to FIG. 3, a PLL based frequency synthesizer 41, or clock generator, generates multiple output frequencies, i.e. both base and FEC clock rates, using a single precision resonator 47 by adding a first (preferably prime number) frequency divider 53 into the PLL feedback path and a frequency multiplier 57 into the feedback path, or alternatively into the output of the clock generator, as explained more fully below. As further explained below, the frequency multiplier is preferably implemented using a delay locked loop, DLL, based frequency multiplier. For illustrative purposes, the present invention is explained in terms of generating either an output base frequency or an output error correction frequency. It is to be understood that other frequency needs may be met with the present invention, and that more than two difference output frequencies may be achieved by use of additional frequency multipliers and/or dividers, as needed.

In the present embodiment, PLL based frequency synthesizer 41 builds upon the basic PLL, discussed above. As before, the present PLL includes a PFD and Charge Pump unit 49, which produces an output control signal indicative of a phase difference and/or frequency difference between its two inputs, i.e. a feedback input and a reference frequency input. The control signal is preferably adjusted by a loop filter 51 before being applied to a frequency control input of a variable frequency oscillator, VFO, 45. Since it is desirous that oscillator 43 be a precision oscillator, variable frequency oscillator 45 is dependent upon a precision SAW or Crystal resonator 47. The output from VFO 45 is fed back to the feedback input of PFD and Charge Pump unit 49 via first frequency divider 53. The present PLL based frequency synthesizer, however further adds a second frequency divider 55 between the Reference Clock Input signal and the reference input node of PFD and Charge Pump unit 49, and adds frequency multiplier 57 at the output of the first frequency divider 53 to produce the desired Output Clock signal. Preferably, first and second frequency dividers 53 and 55 are both integer frequency dividers and first frequency multiplier 57 is an integer frequency multiplier. Further preferably, the integer value of the first and second frequency dividers 53 and 55 and the integer value of the first frequency multiplier 57 are electronically (and preferably digitally) adjustable. A key functionality of the present invention is achieved by appropriate assignment of integer values to frequency dividers 55 and 53 and frequency multiplier 57.

In the present example of achieving a precision PLL capable of selectively generating both a base bit rate and a forward error correction, FEC, rate, an important aspect of the current invention is the recognition that forward error correction codes introduce redundancy bits into the base data stream at a fixed ratio to the base data bits. Thus, knowing the number of added error correction code bits to a base data stream, i.e. a base data packet size, one can determine an integer ratio to relate the base frequency to the FEC code. For example, a practical error correction code might introduce 2 redundant check bits for every 64 data bits [a so-called (66,64) code]. In order to have the modified bit steam with the additional 2 FEC bits take the same transmit, or receive, time as the basic data bit stream having only the base 64 data bits, the frequency of the FEC bit transmission rate must be (66/64)×base frequency rate. Thus the base and FEC transmission rates are related as the ratio of two integers. It is another aspect of the present invention that the integers relating the two rates may be decomposed into prime factors, as explained more fully below.

The present embodiment of FIG. 3 is particularly suited for situations where the frequency of the SAW or crystal resonator 47 is the highest output clock frequency desired. For example, in the specific OC-48 SONET/SDH example discussed above, the base rate is 622.08 MHz. The FEC coding uses a (255,238) code which yields an exact integer ratio of 14/15 and an FEC frequency of approximately 666.5143 MHz.

Using the embodiment of FIG. 3, the desired operation of electronically switching between a base frequency of 622.08 MHz and an FEC frequency of 666.5143 MHz can be achieved by using a resonator 47 of 666.5143 MHz (i.e. the highest desired frequency) to synthesize either frequency, 622.08 MHz or 666.5143 MHz, locked to an appropriately related base or FEC frequency reference clock input.

If the PLL 41 is used in a transceiver that implements FEC, then the reference clock input would be the FEC frequency of 666.5143 MHz, which matches the frequency of resonator 47. Therefore the relating integer ratio (i.e. resonator frequency/input reference frequency) would be (666.5143 MHz/666.5143 MHz), or 1. Therefore, the integer divisor values of frequency dividers 55 and 53 and the integer multiplier value of frequency multiplier 57 would be set to 1. This produces the desired output FEC frequency of 666.5143, directly.

If, however, PLL 41 were to be used in a transceiver that implements the base frequency, then the reference clock input would be 622.08 MHz (or some integer divisor thereof, as explained above). For a reference clock input frequency of 622.08 MHz, the ratio relating the input reference clock input frequency to the resonator frequency of 666.5143 MHz is 14/15, as immediately explained above. Thus, first frequency divider 53 is assigned a value of 15, and first frequency multiplier 57 is assigned a multiply value of 14 to produce an output frequency of (666.5143 MHz× 14/15), or 622.08 MHz, locked to the reference clock input of 622.08 MHz. To assure that the feedback input and the reference input at PFD and Charge Pump unit 49 match, second frequency divider 55 is assigned a value of 14.

Figure 4:
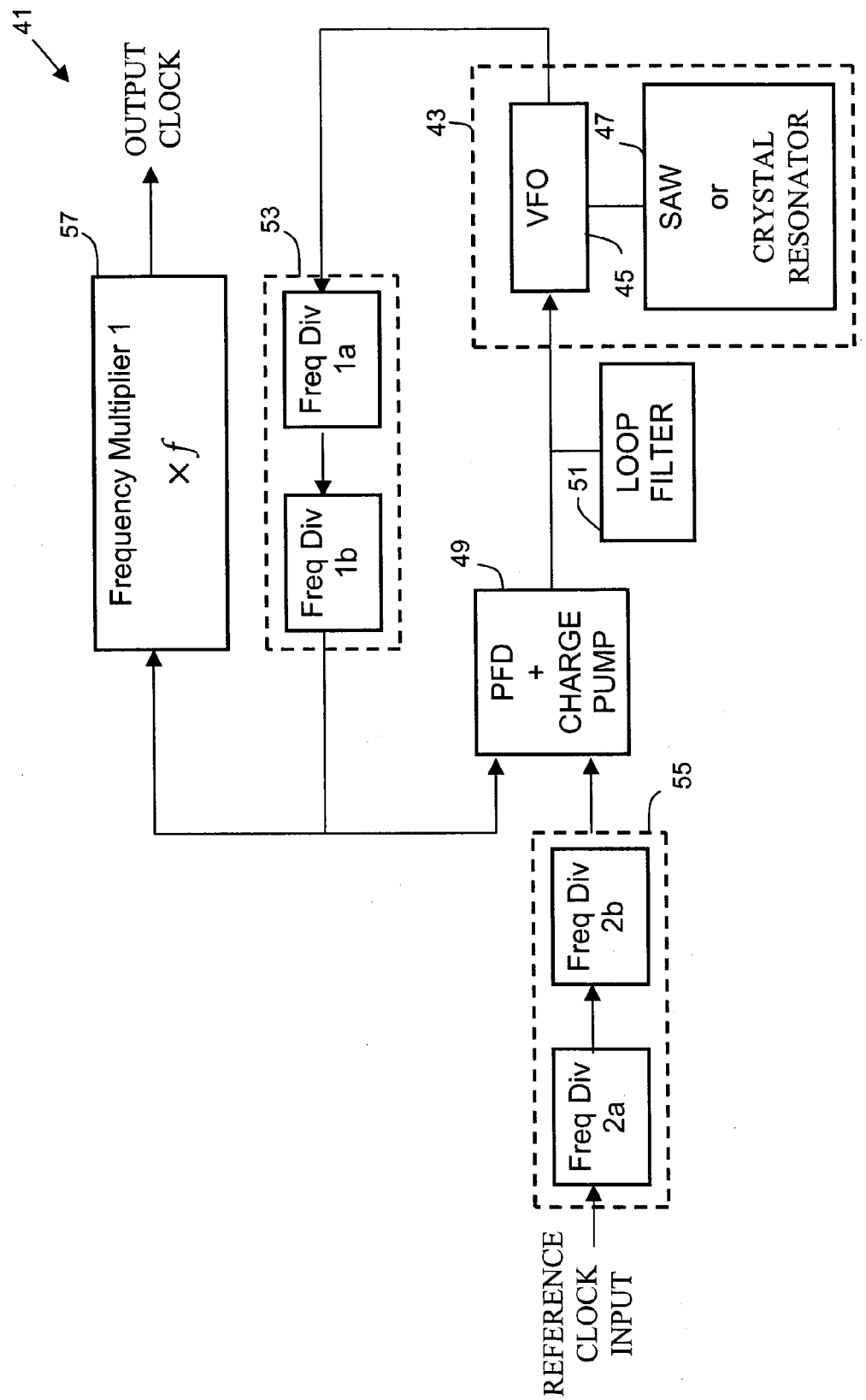
FIG. 4 is an alternate implementation of the embodiment of FIG. 3.

Preferably, first and second frequency dividers 53 and 55 are implemented using counters. To simplify their construction, i.e. minimize the number of counting stages, it is preferred that their divide value be broken down into at least a two-stage division operation. This is exemplified in FIG. 4 wherein first frequency divider 53 is sub-divided into a two-stage cascaded divider consisting of a frequency divider 1a and frequency divider 1b. Similarly, second frequency divider 55 is sub-divided into a two-stages cascade divider consisting of frequency divider 2a and frequency divider 2b. Thus, to assign an overall divide value of 14 to second frequency divider 55, frequency divider 2a may be assigned a value of 7 and frequency divider 2b may be assigned a value of 2. First frequency divider 53 may assign a divide value of 15 to frequency divider 1b and a divide value of 1 to frequency divider 1a.

Since the integer relationship, i.e. the integer ratio, is embodied into counters, the decomposition into prime factors reduces the size of these counters. That is, division values that can be factored may be formed with much shorter cascaded divider chains. For example in the illustration using the (66,64) code discussed above, the factors may be 11 and 6 to produce an overall value of 66, or alternatively the factors may be 11, 3, and 2 to produce the same overall value of 66. Similarly, factors of 8 and 8 may be used to produce an overall value of 64, or the same value may be produce using divide values of 16 and 4.

It if further preferred that the frequency multiplier 57 be implemented as a delay locked loop, DLL, based structure since a DLL based frequency multiplier has the quality of transferring all jitter on its input to its output, without adding any inherent systematic jitter of its own. Thus, a DLL based frequency multiplier may be introduced into a precision clock source without degrading the clock's jitter performance.

Figure 5:
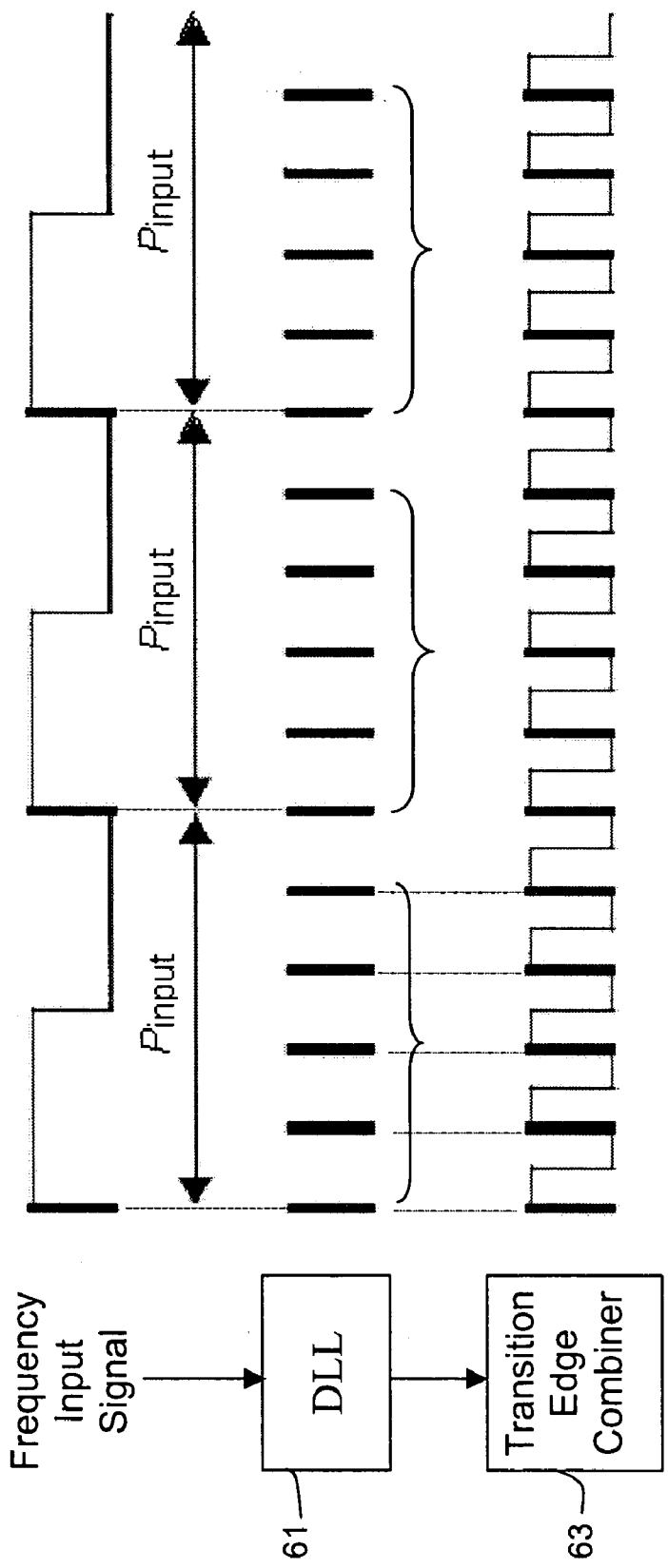
FIG. 5 is general overview of the basic operation of a DLL based frequency multiplier.

With reference to FIG. 5, the basic operation of a DLL based frequency multiplier consist of an input frequency signal applied to a delay locked loop 61 followed by a transition edge detector 63, which outputs the resultant output frequency signal. The input frequency signal is shown to have period of Pinput. The DLL based multiplier multiplies the frequency of the input frequency signal by dividing its period, Pinput, into a multitude of equally spaced logic transition edges. This is typically accomplished by generating multiple copies of the input pulse cycle, with the start of consecutively generated pulses being equally spaced, i.e. delayed, and the generated pulses spanning the entire period Pinput. That is, each generated pulse is a delayed version of the input pulse from the input frequency signal. Transition edge detector generates an output pulse at the beginning of each generated pulse from DLL 61, the output pulse is made to have a period spanning from the beginning of one generated pulse to the next. Thus by dividing an input pulse of period Pinput into an integer number of evenly spaced logic transition edges that span one period of the input frequency signal, one is effectively multiplying the frequency of the input frequency signal by the integer value of the dividing value.

Figure 6:
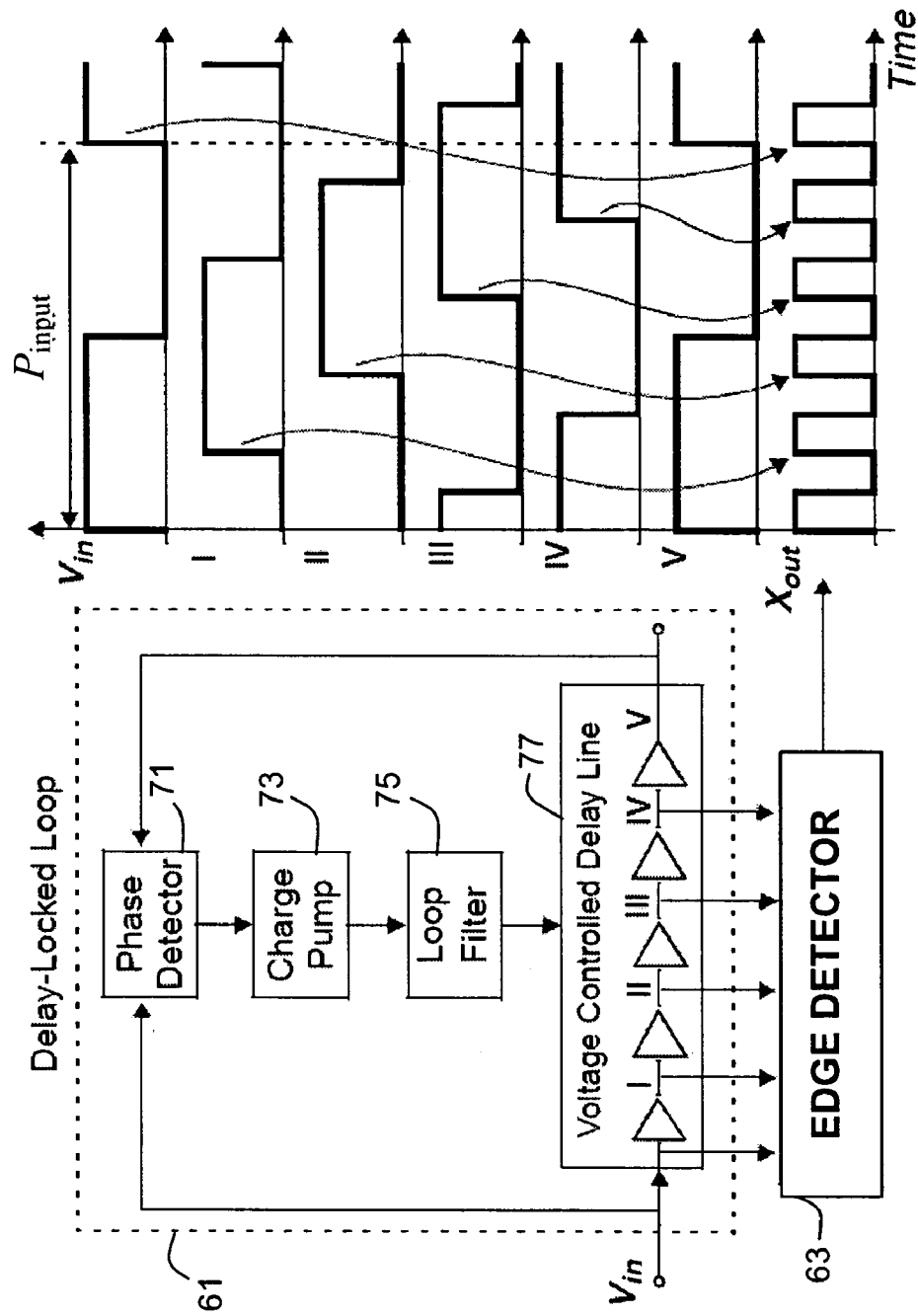
FIG. 6 is a more detailed description of a basic DLL used to implement frequency multiplication.

With reference to FIG. 6, an illustration of the basic components of a DLL includes a phase detector 71 for comparing the frequency input signal (Vin in the present example) to a feedback signal from the output of the DLL. Phase detector 71 outputs a signal dependent on the phase deference at its inputs, which in turn either increases or decreases a control voltage produced by charge pump 73. The control voltage is smoothed by loop filter 75, which outputs a delay control signal to a voltage controlled delay line 77. In the present example, voltage control delay line 77 consists of a chain of series-connected amplifiers (such as inverters) whose logic transition delay is dependent on the delay control signal. Since the amplifiers in the chain are identical, they each introduced the same amount of delay resulting in multiple, shifted copies of the input frequency signal, Vin. This is better illustrated in the timing diagram on the right side of FIG. 6, where each shifted pulse I through V corresponds to outputs I through V in the amplifier chain within delay line 77, as labeled. Edge detector 63 combines the shifted pulses I through V, and outputs a pulse each time a new low to high transition edge is encountered. Thus, the output Xout is a frequency multiplied representation of the input frequency signal, whose multiplication factor is dependent on the number of equally spaced delay divisions introduced by the amplifier chain within delay line 77.

Figure 7:
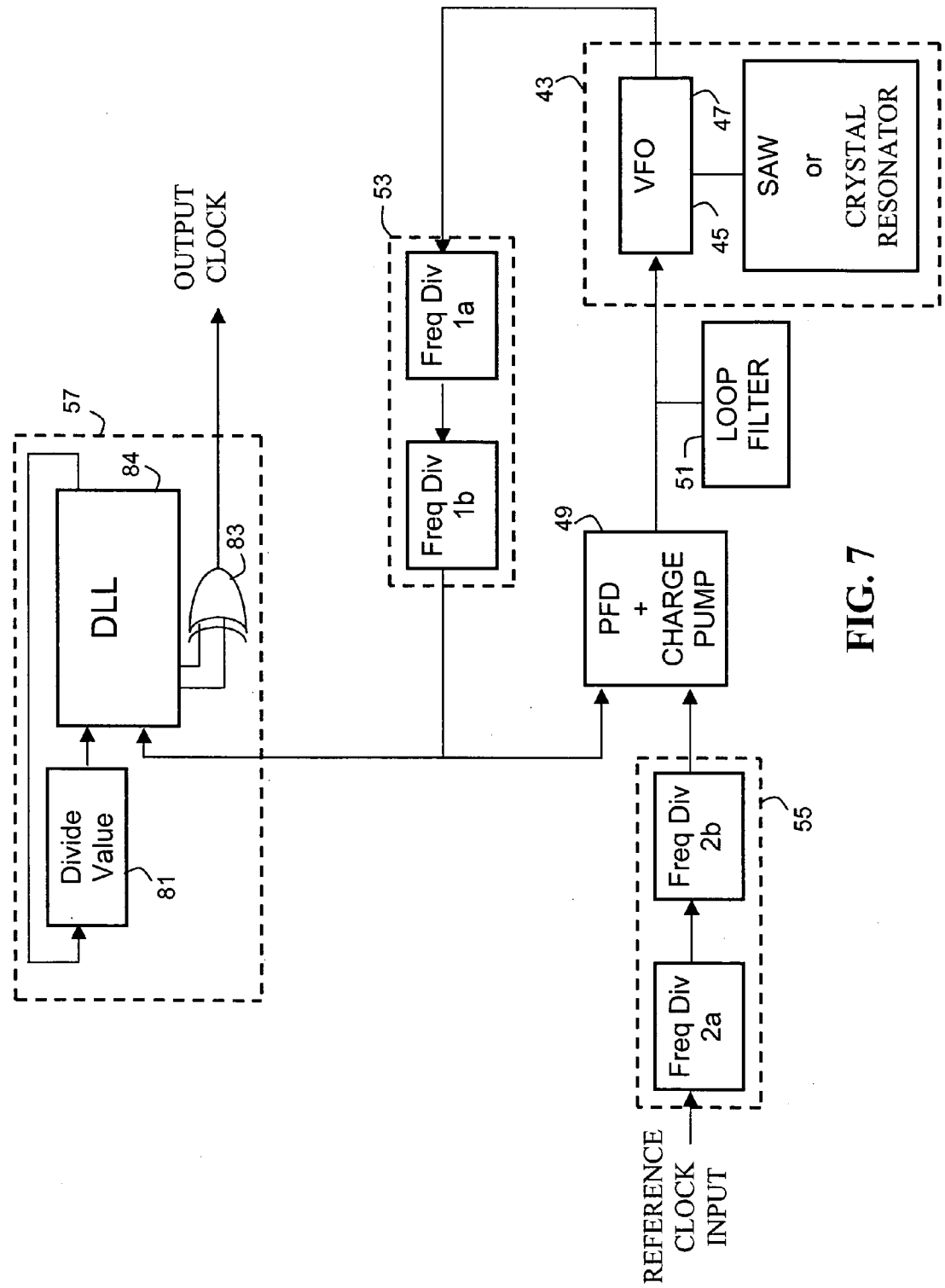
FIG. 7 illustrates the embodiment of FIG. 4 using a DLL based frequency multiplier.

With reference to FIG. 7, a more complete view of the preferred embodiment therefore shows frequency multiplier 57 implemented using a DLL 84. As explained above, the integer divider value in block 57 is actually a multiplication factor that determines the value by which the input frequency will be multiplied. An XOR gate 83 at the output stage is shown for completeness. Like in the example given above with reference to FIGS. 3 and 4, the DLL based frequency multiplier 57 receives an input that is 1/15 of the VFO frequency output (due to frequency divider 53 being set to a divisor value of 15) and must multiply this value by 14 to produced the desired output of 622.08 MHz. The divider ratio, i.e. the integer divide value, of divide block 81 is therefore set to 14 in the present example of FIG. 7. It is to understood that this divide value may be electronically adjusted since the number of delay stages in a delay line within DLL 84 may be electronically modified by electrically inserting and removing delay stages.

Figure 8:
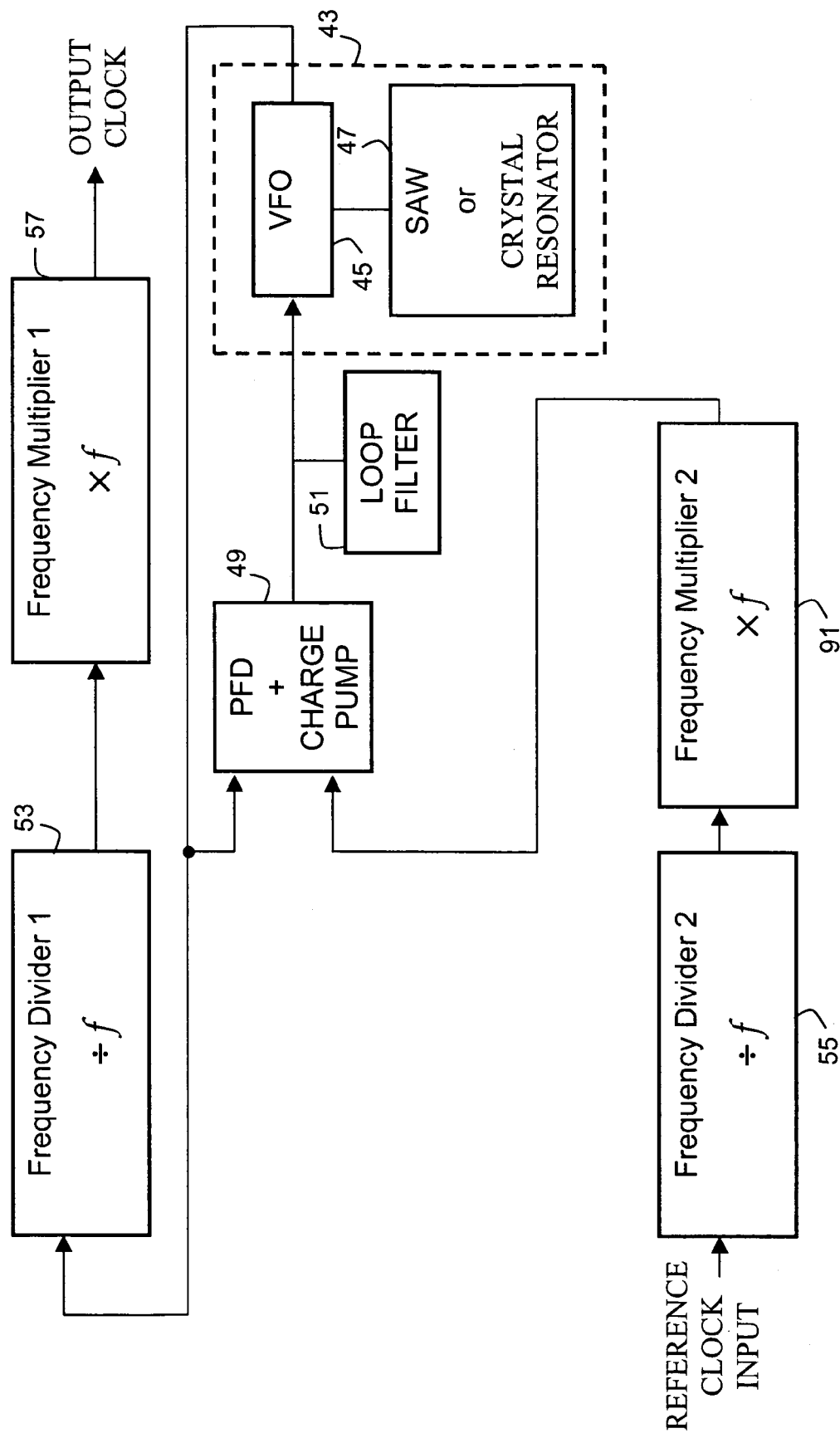
FIG. 8 is a second embodiment of the present invention.

With reference to FIG. 8, an alternate embodiment of the present invention is preferred in situations where the frequency of the resonator 47 within precision oscillator 43 is not the highest desired output frequency. In the specific OC-48 SONET/SDH example discussed above, where the base rate is 622.08 MHz and the FEC rate is 666.5143 MHz, this embodiment would be preferred if the frequency of resonator 47 were the lower base frequency of 622.08 MHz. This embodiment would also be preferred if the phase/frequency comparison of PFD and Charge Pump unit 49 is desired to be performed at the highest possible frequency.

For the sake of consistency, the FEC example discussed above, i.e. (238,255) code, with a 622.08 MHz resonator 47 will be assumed. If the reference clock input has a frequency of 666.6143 MHz (i.e. is used in an FEC application), the combination of second frequency divider 55 and second frequency multiplier 91 (which is preferably a DLL based multiplier) uses the integer factors of the code (15 and 14, respectively) to convert the reference clock input to 622.08 MHz, as explained above, to match the lower operating frequency of resonator 43. That is, input frequency 666.6143 MHz is multiplied by (14/15) to produce a reference frequency signal of 622.08 MHz applied to the reference input node of PFD and Charge Pump unit 49. VFO 45 operates at this frequency with the phase/frequency comparison implemented at 622.08 MHz. Thus, no frequency division is needed in the feedback path from the output of VFO 45 to the feedback input node of PFD and Charge Pump unit 49.

In the present case, therefore, the output of VFO 45 is applied the combination of first frequency divider 53 and first frequency multiplier 57, which are given respective values of 14 and 15, to up-convert the oscillator output from 622.08 MHz to 666.6143 MHz.

Figure 9:
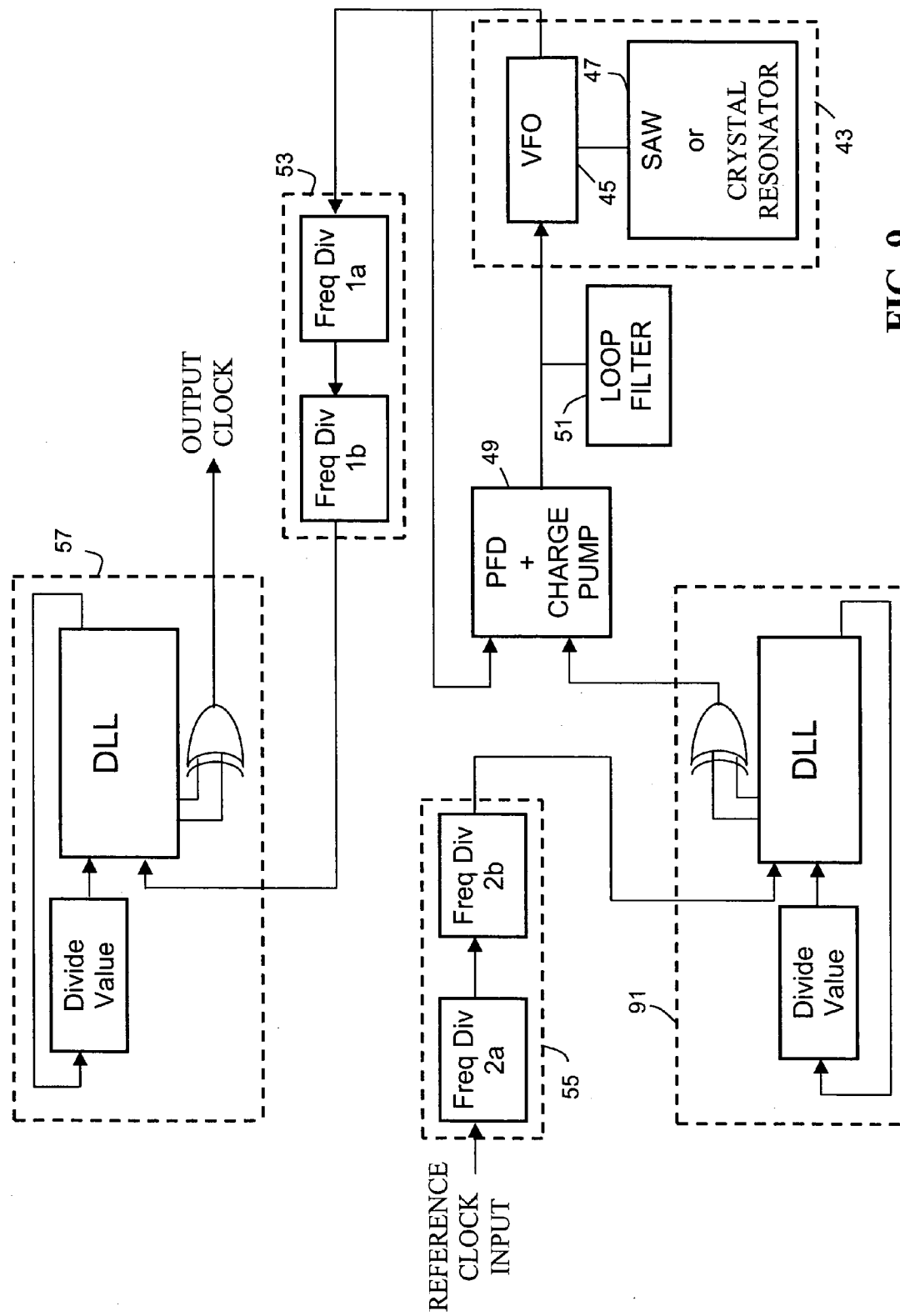
FIG. 9 is an alternate implementation of the embodiment of FIG. 8.

With reference to FIG. 9, it is preferred that frequency dividers 53 and 55 be implemented as cascaded frequency dividers, as discussed above. It is further preferred that frequency multipliers 57 and 91 be implemented as DLL based frequency multipliers, as explained above.

It is to be understood from the above explanations that the 155.52 MHz or 166.6286 MHz (i.e. one fourth input rate) input reference clocks discussed above may also be used in any of the embodiments presented herein with minor alternation to the assigned division and multiplication values. It is also be understood that the divider ratios and DLL ratios may be electronically programmed to achieve the objective of switching between frequencies using electronic means.

The present invention has been described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

What is claimed is:

1. A system for synthesizing an output frequency, comprising;
   a phase locked loop, PLL, including at least one of a phase or frequency difference detector and a variable frequency oscillator having a resonant frequency component;
   wherein said at least one of a phase or frequency difference detector has a feedback signal input and a reference signal input, and is effective for providing a control signal dependent on said feedback signal input and reference signal input;
   wherein said variable oscillator is effective for producing a variable frequency output dependent upon said control signal, said variable oscillator has a predetermined center frequency set by said resonant frequency component and has a limited frequency adjustment range about said center frequency; and
   a first integer frequency divider in series with a first integer frequency multiplier for accepting an input frequency signal at a predetermined input frequency and generating a reference signal for said reference signal input
   wherein a ratio of an integer multiplier value of said first integer frequency multiplier and an integer divisor value of said first integer frequency divider substantially matches a target ratio defined as a ratio of said predetermined center frequency and said predetermined input frequency.

2. The system of claim 1, wherein said predetermined center frequency is higher than said predetermined input frequency.

3. The system of claim 1, wherein said first integer frequency multiplier is a DLL based frequency multiplier.

4. The system of claim 1, further comprising:
   a second integer frequency divider for dividing the frequency of said variable frequency output to produce a stepped down frequency; and
   a second integer frequency multiplier coupled to said second integer divider.

5. A system for synthesizing an output frequency, comprising;
   a phase locked loop, PLL, including a first integer frequency divider, a variable frequency oscillator, and at least one of a phase or frequency difference detector;
   wherein said at least one of a phase or frequency difference detector has a feedback signal input and a reference signal input for receiving a reference input frequency signal, and is effective for providing a control signal dependent on said feedback signal input and reference signal input;
   wherein said variable frequency oscillator is effective for producing a variable frequency output about a predetermined center frequency dependent upon said control signal;
   wherein said first integer frequency divider divides the frequency of said variable frequency output to produce a stepped down frequency;
   a first integer frequency multiplier coupled to receive said stepped down frequency and produce a stepped up output frequency signal;
   a second integer frequency divider in series with a second integer frequency multiplier for accepting an input frequency signal at a predetermined input frequency and generating a reference signal for said reference signal input;
   wherein a ratio of said predetermined center frequency and said predetermined input frequency comprises a target ratio; and
   a ratio of an integer divisor value of said second integer frequency divider and an integer multiplier value of said second integer frequency multiplier substantially matches said target ratio.

6. The system of claim 5, wherein a frequency value of said stepped up output frequency signal is an integer multiple of said predetermined input frequency.

7. The system of claim 5, wherein the integer multiplier value of said second integer frequency multiplier is equal to an integer divisor value of said first integer frequency divider.

8. The system of claim 5, wherein said first integer frequency multiplier is a delay locked loop, DLL, based frequency multiplier.

* * * * *